United States Patent Office 3,467,599

Patented Sept. 16, 1969

3,467,599

ETCHING SOLUTION

Andrew S. Pugliarissi, Sunnyvale, Calif., assignor to Philco-Ford Corporation, Philadelphia, Pa., a corporation of Delaware No Drawing. Filed Aug. 8, 1966, Ser. No. 570,764

Int. Cl. C09k 3/00; C23f 1/04; H05k 3/06

U.S. Cl. 252—79.2 9 Claims

ABSTRACT OF THE DISCLOSURE (1) A metal etching solution consisting essentially of a mixture of 42° Baumé ferric chloride having a concentration of between about 250 milliliters to about 500 milliliters per liter of solution, concentrated hydrochloric acid having a concentration of between about 200 milliliters to about 300 milliliters per liter of solution, concentrated nitric acid having a concentration of between about 200 milliliters to about 300 milliliters per liter of solution, and water having a concentration of up to 250 milliliters per liter of solution. The volume in the solution of each of the constituents nitric acid and hydrochloric acid is less than the volume in the solution of ferric chloride. To reduce the etching rate of the solution, sulphuric acid may be added thereto in an amount not to exceed 5 milliliters per liter of said solution.

(2) The method of selectively etching a metal comprising applying the foregoing solution to said metal.

There is currently a considerable interest in the electronics industry in the production of integrated semiconductor circuits and printed circuit boards. Many integrated and printed circuits are produced by chemical etching or "chemical milling" processes.

Generally, etched circuits are produced by coating a base material with a layer of an electrically conductive material. Selected areas of the electrically conductive material are coated with a material that is insoluble in an etchant to be used. The insoluble material is known as a resist. The exposed and coated portions of the electrically conductive material are covered with the etchant and the etchant is allowed to remain in contact with the exposed and coated portions of the electrically conductive material until the exposed portions of the electrically conductive material have been removed completely. The coated portions of the electrically conductive material are not etched because the resist prevents the etchant from contacting these portions. Any remaining etchant is removed after the desired etching has been achieved and the resist is subsequently removed by a process which does not damage the base material or the electrically conductive material.

From the preceding explanation it is clear that the resist must remain firmly attached to the conductive material during the entire etching process. Prolonged exposure of the coated portions of the electrically conductive material to the etchant allows the etchant to attack the resist and may eventually produce breakdown of the resist. Prolonged exposure to the etchant also allows the etchant to attack the electrically conductive material laterally from the edges of the resist. This produces lateral cutting of the coated portions. Due to the lateral cutting, the coated portions of the electrically conductive material will have rough and uneven edges. It is well kown in the chemical milling art that the straightness of the milled edge is a function of the rate of etching and that undercutting can be prevented by optimizing the etch rate.

One electrically conductive material which is preferred for use in integrated circuits and circuit boards is Kovar. Kovar is the trademark for a series of iron-cobalt-nickel alloys that are described in expired United States Patent No. 2,062,335.

Etching solutions previously available etch Kovar very slowly. Prior art solutions containing combinations of nitric acid, hydrochloric acid, and ferric chloride with other ingredients which have been proposed for etching nickel-iron alloys having a high nickel content have proved to be unsatisfactory in etching Kovar. For example, a prior art etching solution, i.e. 38° Baumé ferric chloride, requires from 50 to 110 minutes to etch through a .003 inch sheet of Kovar. The relatively slow etching increases the possibility that the resist will break down or become detached from the electrically conductive material. Slow etching also increases the lateral cutting action of the etchant. It also greatly increases the manufacturing time of the circuit or circuit board.

Accordingly, an object of the present invention is to provide a chemical etching solution and process which obviates the inherent disadvantages of the prior art.

A more specific object of the invention is to provide a novel etching solution which will produce rapid, accurate etching of Kovar.

A further object of the present invention is to provide a chemical etching solution and process which produces less lateral cutting of a Kovar coating than prior art chemical etching solutions and processes.

A further object of the present invention is to provide a chemical etching process and solution suitable for etching a wide range of conductive materials and which requires less time and is more economical than prior art chemical etching solutions and processes.

The foregoing objects and other objects inherent in the present invention are readily discernible from the following detailed description of the invention.

The disadvantages of the prior art are overcome by my discovery of an aqueous chemical etching solution composed of ferric chloride, nitric acid, and hydrochloric acid in certain selected proportions. A preferred process utilizing the solution of the present invention embraces the selective coating of a metal member with a resist material and the subsequent exposure of the coated metal member to the solution of the present invention.

As previously stated, the solution of the present invention comprises ferric chloride, hydrochloric acid, and nitric acid. It is preferable to use about 375 milliliters of 42° Baumé ferric chloride for every liter of solution. However, satisfactory results will be achieved within the limits of about 250 to about 500 milliliters of 42° Baumé ferric chloride for every liter of solution.

The concentration of hydrochloride acid in the solution is preferably 250 milliliters of concentrated (i.e. 38%) hydrochloric acid for every liter of solution. However, satisfactory results will be achieved within the limits of about 200 to about 300 milliliters of concentrated hydrochloric acid for every liter of solution.

Nitric acid is preferably present in the solution in a concentration of 250 milliliters of concentrated (i.e. 70%) nitric acid for every liter of solution. However, satisfactory results will be achieved within the limits of about 200 to about 300 milliliters of concentrated nitric acid for every liter of solution. The volume of nitric or hydrochloric acid should never exceed the volume of 42° Baumé ferric chloride.

The amount of added water present in the aqueous solution will depend upon the proportions of ferric chloride, hydrochloric acid, and nitric acid present in the solution. No added water is required. However, the solution should not contain more than 250 milliliters of water for every liter of solution in addition to that present in the other three ingredients. A greater concentration of water increases the time required for etching. Satisfactory results have been achieved using 125 milliliters of water for every liter of solution.

Solutions according to the present invention produce satisfactory results when used at a temperature of from 156° F. to 180° F.

Since chemical etching procedures are well-known in the art it is believed that the following single explanatory use of the solution of the present invention clearly describes the improvement resulting from the present invention.

Example

A sheet or coating of an insulating or semiconductive material is coated with a .003 inch thick layer of Kovar consisting of about 29% nickel, 17% cobalt, and 53% iron. The Kovar layer is coated with a light sensitive resist such as Kodak metal etch resist (KMER). Designated areas of the coated sheet are then exposed to light projected through a masking means. The light hardens the areas of the coated sheet upon which it impinges. The unexposed resist is then washed away by means of a suitable solvent such as Kodak KMER developer. This is followed by a water rinse. The coated sheet may then be baked to "set" the resist. After the coated sheet has been baked, the etching solution of the present invention is applied to the coated sheet and resist.

It is theroized that in the removal of the unmasked portions of the Kovar coating by the etching solution, the components of the solution perform the following functions. The ferric chloride and the nitric acid uniformly oxidizes the unmasked portions of the Kovar coating. Oxidation of the Kovar by the ferric chloride changes the ferric chloride to its ferrous state. In its ferrous state the chloride is no longer capable of oxidizing the unmasked portions of the Kovar coating. However, the nitric acid maintains the strength of the ferric chloride by reoxidizing it from its ferrous to its ferric state. The hydrochloric acid and the compounds formed by the interaction of the hydrochloric and nitric acids remove the oxide film from the unmasked portions of the Kovar surface as the film is formed by the ferric chloride. In about 50 to 70 seconds, the solution will etch completely through a .003 inch Kovar coating and form the desired Kovar network on the sheet of insulating or semiconducting material. The remaining resist is then removed to complete the etching process.

Due to the rapid rate in which the solution of the present invention removes the Kovar coating, i.e. 50 to 70 seconds, the possibility that the resist will break down or become detached from the Kovar coating during the etching process is reduced. Furthermore, as is known in the chemical milling art, the rapid etching does not allow the etching solution to attack the resist coated portions of the Kovar laterally and hence the rapid etching produces cuts which are smoother than those produced by prior art etching solutions.

If the etching time is too fast to adequately control the etching process, a small amount of sulphuric acid, i.e. 5 milliliters per liter of solution, can be added to the solution to reduce the etch rate.

While the foregoing example has described the etching of Kovar, the solution can also be used with other materials such as other nickel-iron alloys, copper, nickel, beryllium-copper, and aluminum. In addition to being used in etching integrated and printed circuits, the solution and process of the present invention can be used for etching patterns in metal clad epoxy glass, metal clad plastics and plastic laminates, and for chemictl etching of complex metal members, such as aircraft parts.

What I claim is:

1. An aqueous solution for controlled chemical etching of metals such as Kovar, nickel-iron alloys, copper, nickel, beryllium-copper and aluminum, said solution consisting essentially of a mixture of 42° Baumé ferric chloride having a concentration of between about 250 milliliters to about 500 milliliters per liter of said solution, concentrated (38%) hydrochloric acid having a concentration of between about 200 milliliters to about 300 milliliters per liter of said solution, concentrated (70%) nitric acid having a concentration of between about 200 milliliters to about 300 milliliters per liter of said solution, and water having a concentration of up to about 250 milliliters per liter of said solution, the volume in said solution of each of said nitric acid and said hydrochloric acid being less than the volume in said solution of said ferric chloride.

2. A solution according to claim 1, containing about 375 milliliters of said ferric chloride per liter of said solution, about 250 milliliters of said hydrochloric acid per liter of said solution, about 250 milliliters of said nitric acid per liter of said solution, and about 125 milliliters of water per liter of said solution.

3. A solution according to claim 1 containing sulphuric acid for reducing the etching rate thereof.

4. The solution of claim 3 in which said sulphuric acid has a maximum concentration of 5 milliliters per liter of said solution.

5. A method for chemically etching a metal such as kovar, nickel-iron alloys, copper, nickel, beryllium-copper and aluminum, said method comprising applying to said metal an aqueous solution consisting essentially of a mixture of 42° Baumé ferric chloride having a concentration of between about 250 milliliters to about 500 milliliters per liter of said solution, concentrated (38%) hydrochloric acid having a concentration of between about 200 milliliters to about 300 milliliters per liter of said solution, concentrated (70%) nitric acid having a concentration of between about 200 milliliters to about 300 milliliters per liter of said solution, and water having a concentration up to 250 milliliters per liter of said solution, the volume in said solution of each of said nitric acid and said hydrochloric acid being less than the volume in said solution of said ferric chloride.

6. The method of claim 5 including the additional step of coating portions of said metal with a resist prior to applying said solution to said metal, and wherein said step of applying said solution includes applying said solution to both said metal and said resist.

7. The method of claim 5 in which said solution contains about 375 milliliters of said ferric chloride per liter of said solution, about 250 milliliters of said nitric acid per liter of said solution, about 250 milliliters of said hydrochloric acid per liter of said solution, and about 125 milliliters of water per liter of said solution.

8. The method of claim 5 in which said solution contains sulphuric acid for reducing the etching rate of said solution.

9. The method of claim 8 in which said sulphuric acid has a maximum concentration of 5 milliliters per liter of said solution.

References Cited

UNITED STATES PATENTS

| | | | |
|---|---|---|---|
| 2,684,892 | 7/1954 | Saulnier | 252—79.2 XR |
| 3,232,802 | 2/1966 | Young et al. | 156—18 |

MAYER WEINBLATT, Primary Examiner

U.S. Cl. X.R.

134—41, 42; 156—3, 17, 18, 19